US007647567B1

(12) United States Patent
Esposito et al.

(10) Patent No.: US 7,647,567 B1
(45) Date of Patent: Jan. 12, 2010

(54) SYSTEM AND METHOD FOR SCHEDULING TRS RULES (75) Inventors: Thomas M. Esposito, Medford, MA (US); Mieszko Lis, Cambridge, MA (US); Ravi A. Nanavati, Brighton, MA (US); Joseph E. Stoy, Boston, MA (US); Jacob B. Schwartz, Somerville, MA (US)

(73) Assignee: Bluespec, Inc., Waltham, MA (US)

( * ) Notice: Subject to any disclaimer, the term of this patent is extended or adjusted under 35 U.S.C. 154(b) by 135 days.

(21) Appl. No.: 11/047,329

(22) Filed: Jan. 31, 2005

(51) Int. Cl.
G06F 9/45 (2006.01)
G06F 17/50 (2006.01)
(52) U.S. Cl. .................... 716/2; 716/4; 716/5
(58) Field of Classification Search .......... 716/1, 716/2, 4–5, 18
See application file for complete search history.

(56) References Cited

U.S. PATENT DOCUMENTS

| 5,005,136 | A | 4/1991 | Van Berkel et al. |
| 5,530,863 | A | 6/1996 | Hino |
| 5,862,361 | A | 1/1999 | Jain |
| 6,367,066 | B1 * | 4/2002 | Sato ................. 716/18 |
| 6,584,597 | B1 | 6/2003 | Kishinevsky et al. |
| 6,597,664 | B1 | 7/2003 | Mithal et al. |
| 6,901,055 | B1 * | 5/2005 | Hoe et al. ............. 370/252 |
| 2003/0131324 | A1 | 7/2003 | Takenaka |
| 2004/0052215 | A1 * | 3/2004 | Mithal et al. ............. 370/252 |
| 2004/0093467 | A1 * | 5/2004 | Shen et al. ............. 711/141 |

FOREIGN PATENT DOCUMENTS

| EP | 0 329 233 A2 | 8/1989 |
| EP | 0 829 812 A2 | 3/1998 |
| WO | WO 01/13285 A2 | 2/2001 |

OTHER PUBLICATIONS

Ayala-Rincon, et al., "Architectural Specification, Exploration and Simulation Through Rewriting-Logic," 2002.
Hoe, James C., "Operation-Centric Hardware Description and Synthesis", IEEE Transactions on Computer-Aided Design of Integrated Circuits and Systems, vol. 23, No.9, Sep. 2004, pp. 1277-1288.

(Continued)

*Primary Examiner*—Sun J Lin
*Assistant Examiner*—Suresh Memula
(74) *Attorney, Agent, or Firm*—William A. Loginov; Loginov & Associates, PLLC (57) ABSTRACT

A system and method for Term Rewriting System hardware design employs a scheduler that incorporates a preference order in scheduling conflicting rules. The scheduler schedules a conflicting rule to execute when its predicate is true, and it is preferred over other conflicting rules in the preference order. The preference order may be, in one embodiment, a user-specified preference order enumerated by a designer. Such an order may be chosen according to efficiency criteria, such that the conflicting rule most essential for efficient hardware will be scheduled to execute on a given state rather than less essential conflicting rules The system and method advantageously permits a schedule to be computed in a time frame polynomially related to the number of rules, and produces more predictable and more easily understood schedules than conventional methods.

21 Claims, 8 Drawing Sheets

OTHER PUBLICATIONS

Hoe, James C., "Operation-Centric Hardware Discription and Synthesis," Massachusetts Institute of Technology, Apr. 28, 2000.

Wunderlich, Roland E., et al., "In-System FPGA Prototyping of an Itanium Microarchitecture," Proceedings of the 22nd International Conference on Computer Design (ICCD 2004), Oct. 2004.

Arvind, et al., "Bluespec: Why Chip Design Can't be Left EE's," University of California, Irvine, Mar. 22, 2004.

Nordin, Grace, et al., "Synchronous Extensions to Operation-Centric Hardware Description Languages," IEEE, 2004.

Rosenband, et al., "Modular Scheduling of Atomic Actions," Massachusetts Institute of Technology, Computer Science and Artificial Intelligence Laboratory, Computation Structures Group, Memo 463, Jun. 4, 2004.

Rosenband, et al., "Modular Scheduling of Guarded Atomic Actions," In the Proceedings of the 41st Design Automation Conference (DAC), San Diego, CA, Massachusetts Institute of Technology, Computer Science and Artificial Intelligence Laboratory, Computation Structures Group, Memo 468, Jun. 2004.

Dave, Nirav "Designing a Reorder Buffer in Bluespec," In Proceedings of Formal Methods and Models for Codesign (MEMOCODE '2004), San Diego, California, Massachusetts Institute of Technology, Computer Science and Artificial Intelligence Laboratory, Computation Structures Group, Memo 478, Jun. 2004.

Rosenband, et al., "The Ephemeral History Register: Flexible Scheduling for Rule-Based Designs," In the Proceedings of Formal Methods and Models for Codesign (MEMOCODE '2004), San Diego, California, Massachusetts Institute of Technology, Computer Science and Artificial Intelligence Laboratory, Computation Structures Group, Memo 479, Jun. 22-25, 2004.

Dave, Nirav H., "Designing a Processor in Bluespec," Department of Electrical Engineering and Computer Science, Massachusetts Institute of Technology, Jan. 2005.

Nikhil, R., "Future Programming of FPGAs", Bluespec, Inc., Feb. 23, 2004.

Hoe, et al., "Hardware Synthesis from Term Rewriting Systems," In the Proceedings of X IFIP International Conference on VLSI (VLSI '99), Massachusetts Institute of Technology, Computer Science and Artificial Intelligence Laboratory, Computation Structures Group, Memo 421A, Aug. 20, 1999.

Poyneer, et al., "A TRS Model for a Modern Microprocessor: Computation Structures Group Memo 408", Laboratory for Computer Science, MIT, Jun. 25, 1998.

Liao, et al., "An Efficient Implementation of Reactivity for Modeling Hardware in the Scenic Design Environment", ACM, Inc., 1997.

Shen, et al., "Design and Verification of Speculative Processors", Computation Structures Group Memo 400 (B), Laboratory for Computer Science, MIT, Jun. 1998.

Rosenband, et al., "Flexible and Scalable Hardware Synthesis from Guarded Atomic Actions", MIT Computer Science and Artificial Intelligence Laboratory, 2004.

Hoe, et al., "Hardware Synthesis from Term Rewriting Systems", Computation Structures Group Memo 421A, Laboratory for Computer Science, MIT, Aug. 20, 1999.

Matthews, et al., "Microprocessor Specification in Hawk", IEEE, 1998.

Shen, et al., "Modeling and Verification of ISA Implementations", Computation Structures Group Memo 400(A), Laboratory for Computer Science, MIT, Jun. 20, 1997.

Hoe, et al., "Synthesis of Operation-Centric Hardware Descriptions", Computation Structures Group Memo 426A, Laboratory for Computer Science, MIT, Jul. 29, 2000.

Arvind, et al., High-level Synthesis: An Essential Ingredient for Designing Complex ASICs, Nov. 6, 2004.

Poyneer, et al., "A TRS Model for a Modern Microprocessor: Computation Structures Group Memo 408", Laboratory for Computer Science, MIT, Jun. 25, 1998.

Liao, et al., "An Efficient Implementation of Reactivity for Modeling Hardware in the Scenic Design Environment", ACM, Inc., 1997.

Shen, et al., "Design and Verification of Speculative Processors", Computation Structures Group Memo 400 (B), Laboratory for Computer Science, MIT, Jun. 1998.

Rosenband, et al., "Flexible and Scalable Hardware Synthesis from Guarded Atomic Actions", MIT Computer Science and Artificial Intelligence Laboratory, 2004.

Hoe, et al., "Hardware Synthesis from Term Rewriting Systems", Computation Structures Group Memo 421A, Laboratory for Computer Science, MIT, Aug. 20, 1999.

Matthews, et al., "Microprocessor Specification in Hawk", IEEE, 1998.

Shen, et al., "Modeling and Verification of ISA Implementations", Computation Structures Group Memo 400(A), Laboratory for Computer Science, MIT, Jun. 20, 1997.

Babb, et al., "Parallelizing Applications into Silicon", 1999.

Windley, P., "Specifying Instruction-Set Architectures in HOL: A Primer", 1994.

Hoe, et al., "Synthesis of Operation-Centric Hardware Descriptions", Computation Structures Group Memo 426A, Laboratory for Computer Science, MIT, Jul. 29, 2000.

Arvind, et al., "Computer Architecture Modeling, Synthesis, and Verification", Laboratory for Computer Science, MIT, Mar. 2003.

Arvind, et al., "Using Term Rewriting Systems to Design and Verify Processors", Computation Structures Group Memo 419, Laboratory for Computer Science, MIT, Nov. 1998.

Bluespec, Inc., Bluespec™ SystemVerilog, Version 3.8, Reference Guide, Preliminary Draft, Sep. 2, 2004, (included by reference in specification, not considered admitted prior art).

* cited by examiner

| CASE | CAN_FIRE$_a$ | CAN_FIRE$_b$ | CAN_FIRE$_c$ | RULES TO FIRE |
|---|---|---|---|---|
| 1 | 0 | 0 | 0 | NONE |
| 2 | 0 | 0 | 1 | RULE c |
| 3 | 0 | 1 | 0 | RULE b |
| 4 | 0 | 1 | 1 | RULE b. RULE c |
| 5 | 1 | 0 | 0 | RULE a |
| 6 | 1 | 0 | 1 | RULE a. RULE c |
| 7 | 1 | 1 | 0 | RULE a |
| 8 | 1 | 1 | 1 | RULE a. RULE c |

SYSTEM AND METHOD FOR SCHEDULING TRS RULES

BACKGROUND OF THE INVENTION

1. Field of the Invention

This invention relates generally to the design and synthesis of digital circuits and specifically to the scheduling of rules in a Term Rewriting System (TRS).

2. Background Information

Hardware Description Languages (HDLs) have been used for many years to design digital systems. Such languages employ text-based expressions to describe electronic circuits, enabling designers to design much larger and more complex systems than possible using previously known gate-level design methods. With HDLs, designers are able to use various constructs to fully describe hardware components and the interconnections between hardware components. Additionally, time-dependency and concurrency, important attributes of most digital circuits, can be easily described.

One popular Hardware Description Language is Verilog, first implemented by Phil Moorby of Gateway Design Automation in 1984, and later standardized under IEEE Std. 1364 in 1995. Currently, Verilog is supported by a wide variety of software tools and exists in several different incarnations and versions. One factor that has led to Verilog's popularity is its ability to describe a digital system at several levels of abstraction.

At one level of abstraction, Verilog may operate as a Register-Transfer Language (RTL) in which circuits have, or are abstracted to have, a set of registers. A designer may use an RTL to specify the values of the registers in each clock period in terms of the values of the registers in the proceeding clock period. In this way, an RTL implements a finite state machine (FSM) of the circuit to be specified. While envisioning the circuit as an FSM, the designer explicitly manages concurrency of execution by scheduling the exact cycle-by-cycle interactions between multiple concurrent states. To design a more complex digital circuit, such as a pipelined central processing unit (CPU), using an RTL approach, a designer generally will define a number of modules, each as an FSM. The designer then specifies the interoperations of these modules so that they may operate concurrently.

As hardware systems become more complex, for example if one were to add out-of-order speculative instruction execution to the pipelined processor mentioned above, RTL design becomes increasingly complicated. With added complexity, design mistakes become more common, especially in coordinating interactions between multiple finite state machines. The designer must manage an increasingly complicated mental model to design and interconnect FSMs. This difficulty is compounded by the large size of the RTL code, which makes debugging more difficult.

In an attempt to address these issues, designers have sought to specify digital circuits in "behavioral" terms, rather than in terms of transitions between states. In a behavioral specification, the focus is on the functions performed by the circuit, rather than on individual register values. When several behaviors are described, the designer typically employs multiple threads of computation with message-passing or shared-memory. At another level of abstraction, Verilog may support a behavioral specification approach. Similarly, a behavioral specification may be implemented in other languages such as System C, an open-source kernel that extends the C++ language to enable hardware design.

The behavioral specification approach allows more rapid specification of circuits than RTL design, and, due to its simpler structure, produces specifications that are more easily debugged. Yet, as with RTL specifications, designers of behavioral descriptions still must explicitly manage the interactions between concurrent operations. Also, it is rarely possible or practical to synthesize an equivalent digital circuit directly from a given behavioral specification. Often, the behavioral specification must first be translated into a lower-level specification before synthesis. Finally, formal verification of a behavioral specification is often very difficult or impossible due to the nature of the specification.

To address these and other shortcomings, a hardware design approach centered upon Term Rewriting System (TRS) technology has been developed. Term Rewriting traces its foundations back to 1930s mathematical logic theory, but only recently has been adapted to hardware design. A TRS approach to hardware design employs a list of "terms" that describe hardware states, and a list of "rules" that describe behavior. A "rule" captures both a state-change (an action) and the conditions under which the action can occur. Further, each rule has atomic semantics, that is, each rule executes fully without interactions with other rules. This implies that, even if multiple rules are executed on a given state, they can be considered in isolation for analysis and debugging purposes.

More formally, a Term Rewriting System has rules that consist of a predicate (a function that is logical true or false) and an action body (a description of a state transition). A rule may be written in the following form:

rule $r$: when $\pi(s) \Rightarrow s := \delta(s)$ where s is the state of the system, $\pi$ is the predicate, and $\delta$ is a function used to compute the next state of the system. The expression $s := \delta(s)$ comprises the action body of the rule. If $\pi(s)$ is true, then $\delta(s)$ defines the next state of the system. In a strict implementation of a TRS, only one rule may execute on a given state. However, as explained further below, concurrent application of rules is desirable for efficient execution. Therefore if several rules are applicable on a given state, some implementations may allow more than one rule to be selected to update the system. Afterwards, all rules are re-evaluated for applicability on the new state of the system and the process continues until no further rules are applicable. In practice, abstract data types such as arrays and First In First Out (FIFO) queues are often used to make the descriptions more readable.

It has been found that the quality of the hardware generated by a TRS system is dependent on the order and concurrency of the application of the rules. While some rules may be executed concurrently, others conflict (for example, they both attempt concurrent access to a single-ported resource) and must be executed sequentially. Therefore, prior approaches to TRS hardware design have implemented a scheduler to determine which rules will execute in each clock cycle.

One type of scheduler that has been employed is a priority encoder which asserts one executable rule in each clock cycle. This type of scheduler may also include round-robin functionality that ensures that if a rule remains applicable for a sufficient number of consecutive clock cycles then it will be selected for execution. Unfortunately, the efficiency of hardware produced by the priority encoder scheduling method has been found to be inadequate. Further details relating to the priority encoder may be found below.

Another type of scheduler that has been previously implemented is an enumerated scheduler (also termed direct table encoder). In an enumerated scheduler, applicable rules are listed in an enumerated encoder table, a lookup table constructed to contain an explicit listing of the rules that can execute given a certain combination of applicable rules. Such a table is constructed so that the maximum number of non-conflicting rules execute on a given clock cycle. A more detailed discussion of the enumerated scheduler may be found below.

While the enumerated scheduler has been found to generate relatively efficient hardware, computation of the lookup table necessary for the scheduler is computationally intensive and takes an unacceptable amount of processing time. Indeed, as explained more fully below, the best known implementation of an enumerated scheduler requires processing time exponentially related to the number of rules considered, thereby making the scheduler impractical for highly complex systems.

In order to make the TRS approach to hardware design more viable, a more capable scheduler than either the priority encoder or the enumerated scheduler is required. It would be desirable for such a scheduler to generate hardware of equivalent quality to hand-coded RTL design, while not consuming an inordinate amount of processing time, so that it would be practical for highly complex systems.

SUMMARY OF THE INVENTION

Briefly, the present invention provides a system and method for scheduling Term Rewriting System (TRS) rules in a hardware design system. The system and method employs a scheduler that incorporates a preference order in scheduling conflicting TRS rules applicable on a given state. A conflicting rule is scheduled to execute when its predicate is logical true, and it is preferred over other conflicting rules in the preference order. Non-conflicting rules may execute concurrently so long as their predicates are logical true. In this way, the most preferred rule of a conflicting set, and any applicable non-conflicting rules, are scheduled to execute on the given state.

In one embodiment, the preference order may be a user-specified preference order, where the order is enumerated by a designer or other type of user. In such an embodiment, the user-specified preference order may be enumerated in one or more attribute statements incorporated into the system specification. The user need not enumerate a user-specified preference order for all TRS rules, only for conflicting rules, thereby minimizing user input.

Preference order may be chosen according to a variety of criteria. In one embodiment, preference order may be chosen according to efficiency criteria, such that the conflicting rule most essential for efficient hardware is scheduled to execute on a given state rather than less essential conflicting rules.

In addition to decreasing the computation time required to compose a schedule, the scheduler produces schedules that are predictable and easily understood. Further, the scheduler allows the designer more influence and tighter control over the final circuit generated than typically possible with prior techniques. Debugging is also simplified since the designer is assured an applicable rule will execute when its predicate is true and it is preferred in the preference order. Furthermore, where the preference order is based upon an urgency order, the use of an urgency order allows for data-dependency between rules, as described further below.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
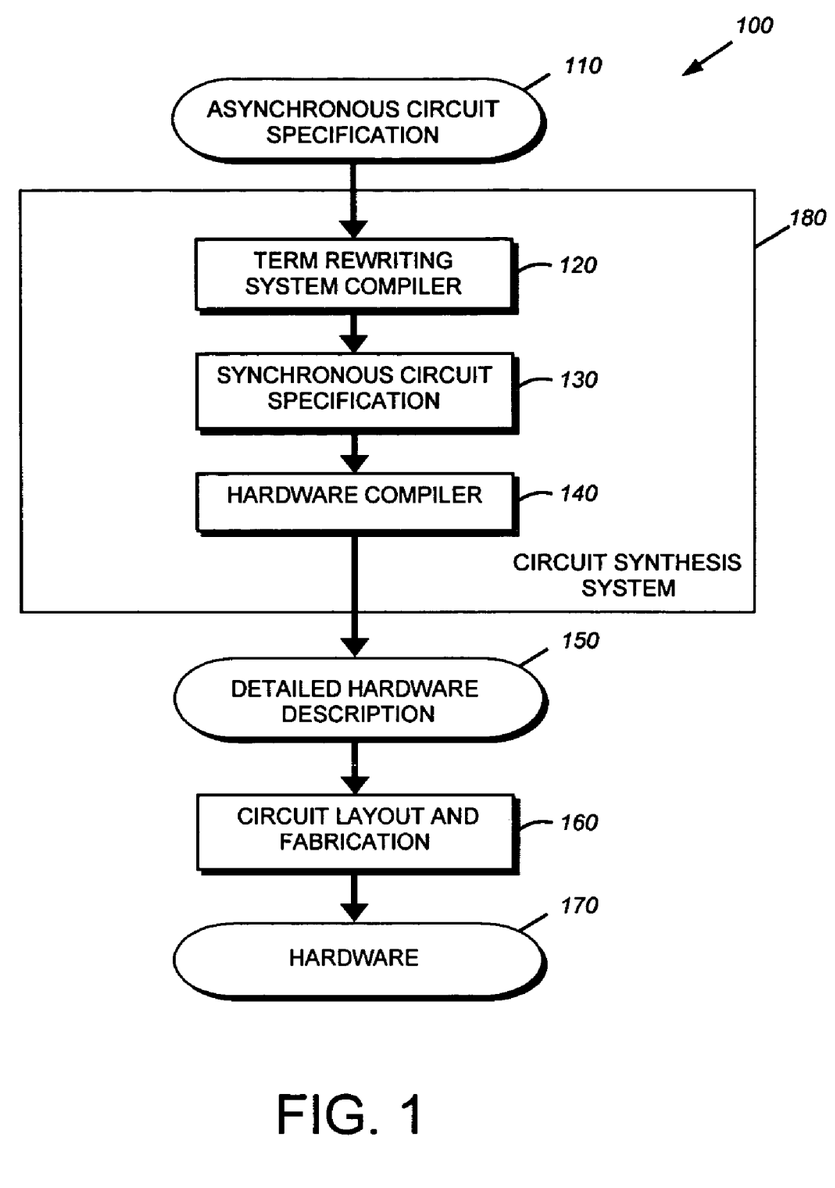
FIG. 1 is a flow diagram of a circuit synthesis system that accepts an asynchronous circuit specification and produces a synchronous hardware circuit.

FIG. 1 depicts a circuit synthesis system 180 that accepts an asynchronous circuit specification 110 and produces a detailed hardware description 150 that describes a synchronous (clocked) hardware circuit 170. The circuit synthesis system 180 includes a Term Rewriting System Compiler (TRSC) which accepts an asynchronous circuit specification 110 and produces a synchronous circuit specification 130. TRSC 120 is a software application that, when executed on a computer, implements the circuit synthesis approach described below. In one embodiment of the circuit synthesis system 180, the synchronous circuit specification 130 takes the form of an RTL Verilog description. It should be noted that the circuit specification 130 may alternately be implemented in another suitable Hardware Description Language, such as, for example, the Very High Speed Integrated Circuits (VHSIC) Hardware Description Language (collectively termed VHDL) described by IEEE Std. 1076.

The Synchronous Circuit Specification 130 is passed to hardware compiler 140, which is, in one embodiment, a Verilog compiler that produces a detailed hardware description 150 as output. A circuit layout and fabrication system 160 makes use of the detailed hardware description 160 to fabricate circuit hardware 170, in one possible example, an application specific integrated circuit (ASIC). Hardware circuit 170 is configured according to the synchronous circuit specification 130 and thereby operates to produce results consistent with asynchronous circuit specification 110.

Considering this system in more detail, asynchronous circuit specification 110 may be specified according to a Term Rewriting System (TRS). As discussed above, a Term Rewriting System generally employs rules that have a predicate and an action body, and may be written in the general form:

$$\pi(s) \Rightarrow s := \delta(s)$$

where $\pi$ is the predicate and $s := \delta(s)$ is the action body. Function $\delta$ is used to compute the next state of the system from the current state s. The system functions by selecting a rule whose predicate is true, and then atomically (without interaction with other rules) executing the rule's action body. The selecting and executing of rules continues as long as some rule's predicate is true.

Such a system is suited for design and verification of complex digital systems as explained in Arvind and X. Shen, "Using Term Rewriting Systems to Design and Verify Processors," MIT LCS Memo CSG-419, *IEEE Micro*, May/June 1999; Mithal et al., Digital Circuit Synthesis System, U.S. Pat. No. 6,597,664; and Mithal et al., Digital Circuit Synthesis System, U.S. patent application Ser. No. 10/264,962, all of which are incorporated by reference herein in their entirety.

In an illustrative embodiment, the asynchronous circuit specification 110 may be specified in Bluespec™ SystemVerilog (BSV) which implements Term Rewriting System semantics in combination with other high level programming constructs as described in the Bluespec™ SystemVerilog Version 3.8 Reference Guide, incorporated herein by reference. It is expressly contemplated, however, that other suitable languages implementing a Term Rewriting System may be employed with the approaches described below. If asynchronous circuit specification 110 is a BSV specification, TRSC 120 may be a Bluespec™ Compiler (BSC) or another suitable compiler adapted to implement the scheduling and circuit synthesis approaches described below.

To illustrate an example of TRS rules in hardware design, let asynchronous circuit specification 110 characterize a circuit for computing the greatest common devisor (GCD) of two numbers using Euclid's algorithm. This example is chosen merely to illustrate a possible use of Term Rewriting System rules, and in no way limits the type of circuit that can be characterized by, or the syntax used in, asynchronous circuit specification 110. In this example, the asynchronous circuit specification 110 may read in part:

```
module mkGCD (ArithIO# (int));
    Reg# (int) x( );
    mkReg#(0) the_x (x);
    Reg#(int) y( );
    mkReg#(0) the_y (y);
    rule flip (x>y && y !=0);
        x<=y;
        y<=x;
    endrule
    rule sub (x<=y && y !=0);
        y<=y-x;
    endrule
    method Action input (int ix, int iy) if (y==0);
        action
        x<=ix;
        y<=iy;
        endaction
    endmethod: input
    method int output( ) if (y==0);
        return x;
    endmethod: output
endmodule: mkGCD
```

Referring to the exemplary code above, the module defines two registers, registers x and y. Further the module defines two rules, flip and sub, that implement Euclid's algorithm on registers x and y. Each rule contains a predicate and an action body. For example in rule flip, the expression, x<=y&&x !=0 forms the predicate and the register write statements, x<=y;

y<=x;

form the action body.

If a predicate is omitted, the rule is assumed to always apply, and if the action body is omitted the rule has no effect. Assuming the registers x and y have been initialized with input values, the rules will repeatedly update the registers with transformed values, terminating when the register y contains zero. At that point, the rules cease executing, and the GCD result is placed in register x. Note that, in this basic example, the two rules flip and sub are never applicable at the same time. In more complicated examples, predicates for multiple rules may be true for a given state. For example, we could replace the expression "x>y" with "x>=y" in the predicate of rule flip. In this new example, more than one rule could apply in each cycle and a determination would have to be made as to whether the rules conflict. Thus, the system would have to determine whether to execute rule flip, rule sub, or both rules on the same state.

Figure 2:
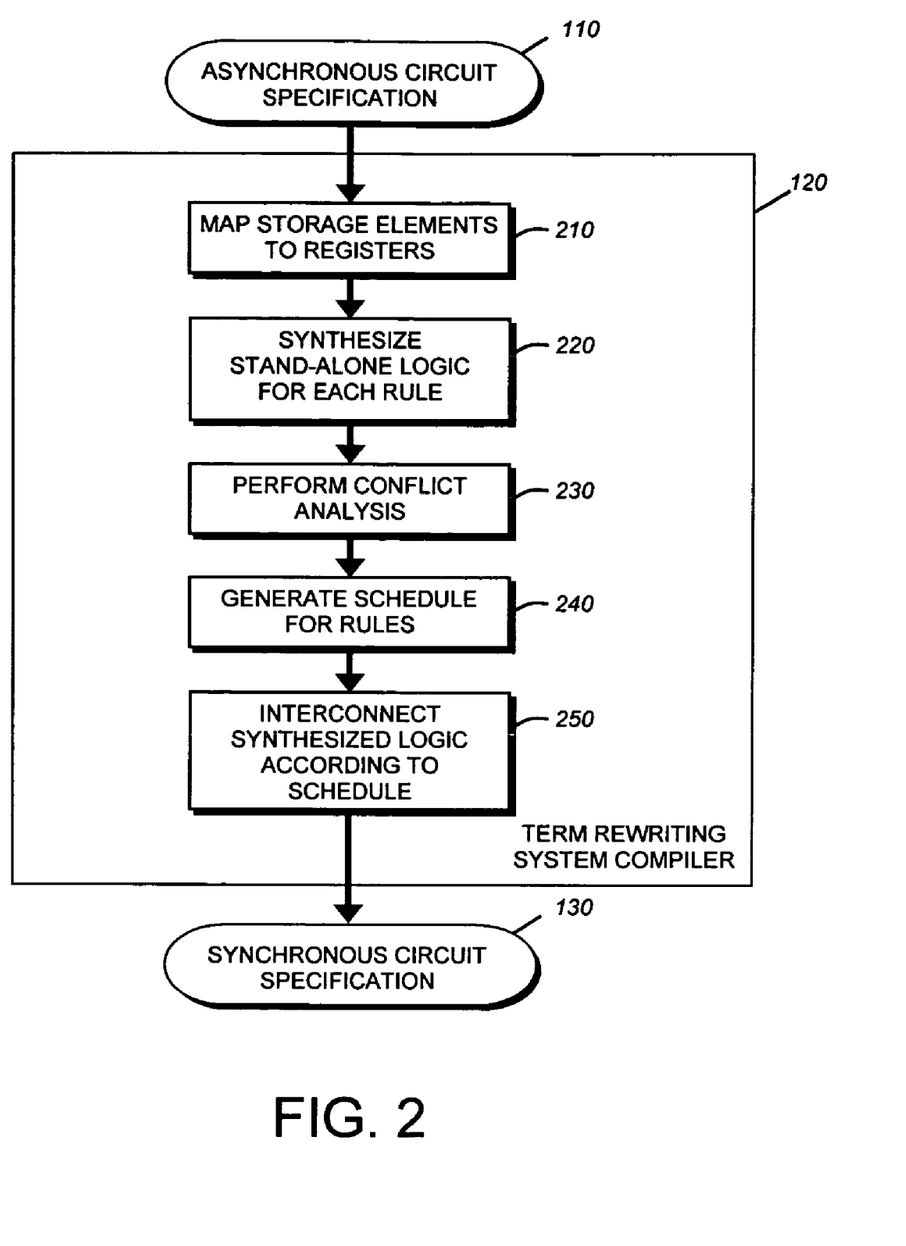
FIG. 2 is a flow diagram of a Term Rewriting System Compiler used with the circuit synthesis system to convert an asynchronous circuit specification to a synchronous circuit specification.

FIG. 2 is flow diagram of a Term Rewriting System Compiler used with the circuit synthesis system to covert an asynchronous circuit specification to a synchronous circuit specification. The steps in FIG. 2 are not necessarily performed in the sequence illustrated in the figure, and some steps may be performed in parallel. Therefore, any such reordering of these steps should be considered within the scope of this description. At step 210, the TRSC 120 maps any storage elements specified in asynchronous circuit specification 110 into registers or other predefined circuit elements for use with a synchronous circuit. Next, in step 220, the TRSC 120 synthesizes enabling logic from the predicate, and updating logic from the action body of each rule, forming a representation essentially equivalent to the logic circuits needed to implement the rule. Note that these logic circuits associated with each rule are disconnected and do not yet form an overall circuit representation at this step. In step 230, TRSC 120 analyzes rule conflicts. That is, the TRSC identifies which rules are applicable in the current state, and identifies any conditions that would prevent concurrent execution of these rules. Next, in step 240, the TRSC generates scheduling logic that triggers a particular set of applicable rules to execute in a given clock cycle to construct the synchronous digital circuit. Finally, in step 250, the TRSC 120 interconnects the synthesized logic according to the schedule, forming the synchronous circuit specification 130. Optimization operations may also be performed to refine the synchronous circuit specification 130.

Considering in more detail some of the steps described above, in step 210 the TRSC 120 maps storage elements in the asynchronous circuit specification 110 into a variety of actual circuit elements whose values determine the state of the system. Asynchronous circuit specification 110 may include data type declarations for a variety of types of storage elements. If scalar storage elements are used, the mapping by the TSRC 120 may be direct into a register circuit. If abstract storage elements are used, such as register files or FIFO queues, the TRSC 120 may map these elements into predefined circuit elements, for example, elements provided in a library of elements associated with the HDL used in the system.

In step 220, the TRSC 120 synthesizes logic to implement the predicate and the action body of each Term Rewriting System rule. Formally, for a rule i, TRSC 120 synthesizes logical expressions, $\pi_i(s)$ and $\delta_i(s)$ where the term s represents the state of the system, i.e., the values in all the storage elements.

In step 230, the TRSC 120 determines which rules may conflict if they execute concurrently and which rules are free from conflicts. Conflict-free rules are rules that can execute simultaneously without incident, that is, they do not update the same state nor update the state accessed (read) by the other rules. Such conflicts may be thought of as two devices attempting to access the same hardware resource, such as, for example, a single memory port, whereby only one device may have access at a time. In addition, a conflict may be defined where, for example, two ports are to be used but there is a write/write conflict (where dequeue and enqueue are not permitted), or there is a write/read conflict (where the first is not allowed after dequeue). In general, the term conflict, as used herein, should be taken broadly to include any situation where rules may potentially conflict in the future or even where rules do not conflict in the purely logical sense, but may be deemed to conflict by the user for the sake of convenience. For example, where rule A conflicts both with B and C, but B and C do not conflict with each other, the designer may arbitrarily specify the order A-B-C, thus implying a conflict between B and C.

The conflict-free condition between two rules may be stated formally as follows. Consider two rules, rule i and rule j, with predicates $\pi_i$ and $\pi_j$ and next states defined by functions $\delta_i$ and $\delta_j$. Further, let s be the state of the system. If $\pi_i(s)$ and $\pi_j(s)$ are both true for some state s, then both $\pi_i(\delta_j(s))$ and $\pi_j(\delta_i(s))$ must also be true so that both rules remain enabled after the state transition enabled by the other rule. Furthermore, the effect of the updates must not depend on the order of the updates, that is, $\delta_i(\delta_j(s))$ must equal $\delta_j(\delta_i(s))$. Note that, as defined generally herein, a conflict between two or more rules is a condition which can arise only when each rule has a predicate that is a logical true.

A variety of algorithms and data structures may be employed to help determine which rules are free from conflicts. One such structure is the Binary Decision Diagram (BDD), a data structure commonly thought of as a rooted, directed, acyclic graph with vertices that represent variables and edges connecting the vertices that represent values of the variables. Thus, a path through a BDD represents a particular assignment of values to variables. Such a structure may be advantageously employed to determine that two rules may never execute on the same state and therefore may never be in conflict. As a practical matter, it may prove difficult or not possible to derive if two particular rules are conflict-free in all cases. Accordingly, this invention contemplates a failsafe conflict designation to ensure two rules do not conflict where they are not otherwise verified to be conflict-free.

In step 240 the TRSC generates scheduling logic that indicates which rules should execute in a particular cycle of the synchronous circuit. Such a determination is performed by a scheduler as described in more detail below in reference to the subsequent figures.

Figure 3:
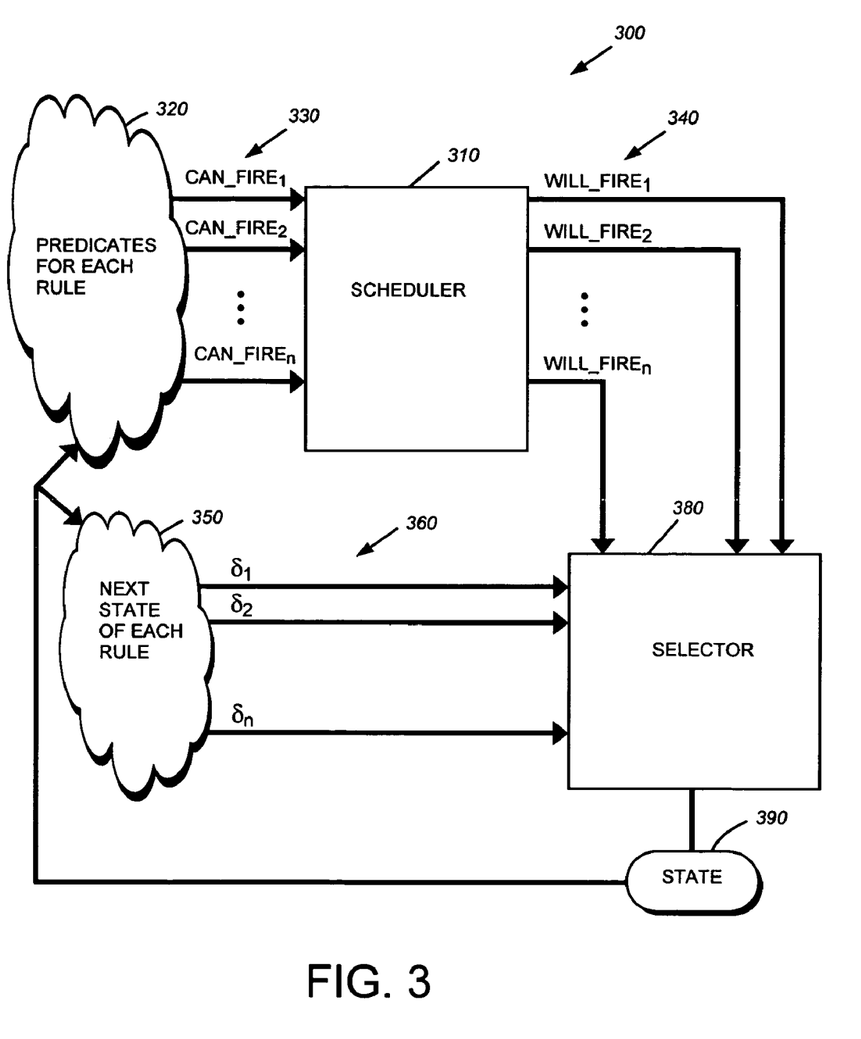
FIG. 3 is a generalized block diagram representing an abstraction of the hardware which is generated to implement a Term Rewriting System.

FIG. 3 is a generalized block diagram of a scheduling system 300 that includes a scheduler 310 for the scheduling of Term Rewriting System rules and a selector 380 for implementing a schedule. More particularly, this diagram is representative generally of an abstraction of the hardware, which is generated to implement the Term Rewriting System. The predicates of each applicable rule 320 may be represented as a series of CAN_FIRE signals 330, where CAN_FIRE$_1$ . . . CAN_FIRE$_n$ correspond to rules 1 to n. It should be noted that CAN_FIRE signals are an alternate representation of predicates, which have been referred to by the mathematical function $\pi$ above. If the predicate of an applicable rule is true, the corresponding CAN_FIRE signal is asserted and passed to scheduler 310. The scheduler determines which rules will execute and then generates a series of WILL_FIRE signals 340, where WILL_FIRE$_1$ . . . WILL_FIRE$_n$ correspond to rules 1 to n. An asserted WILL_FIRE signal indicates a particular rule will execute on a given state. Selector 330 receives both WILL_FIRE signals 340 and the next state associated with each Term Rewriting System rule 350 transmitted as $\delta$ signals 360, where $\delta_1$ . . . $\delta_n$ correspond to rules 1 to n. The selector 380 thereafter applies the $\delta$ signals corresponding to the asserted WILL_FIRE signals, and produces a new state 390 for the system. The new state 390 compels a new set of predicates 320 and next states 350 to be considered.

In more detail, the scheduler 310 determines which rules will execute on each state. It has been found that the quality of the hardware generated by a TRS system is dependent on the order and concurrency of the application of rules. Generally it is desirable for a scheduler to execute multiple rules in a given cycle, as the hardware generated is more efficient (i.e. that the generated hardware will execute a given task in fewer cycles). Further, it is desirable for the generation of the scheduler to consume a reasonable amount of processing time, as a scheduler that consumes excessive processing time is practically unfeasible for complex circuit designs.

Figure 4:
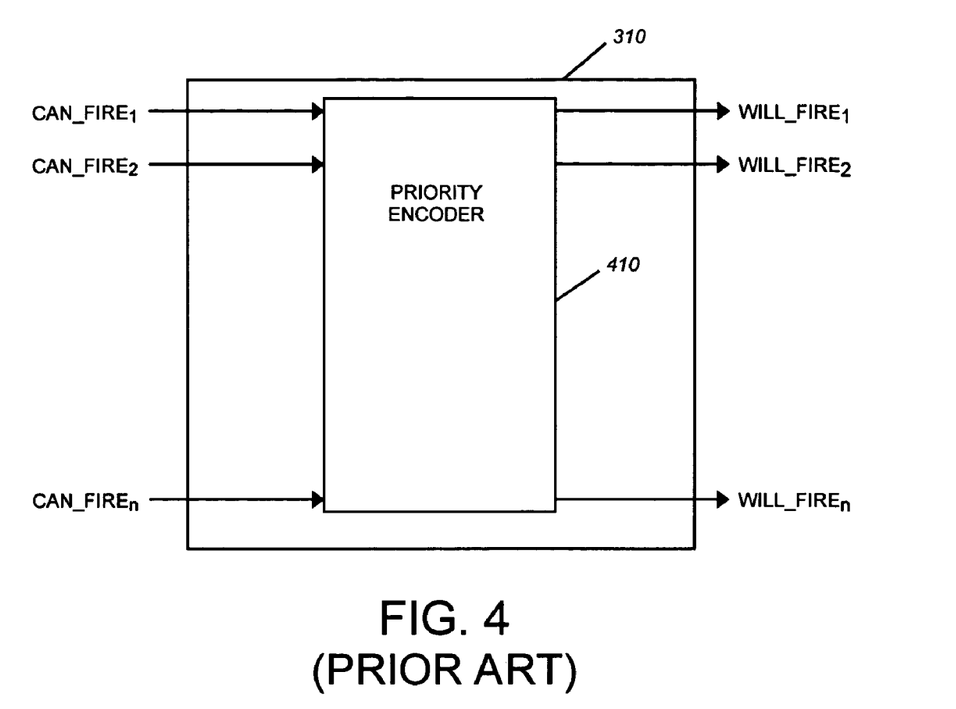
FIG. 4 is a more detailed block diagram of a scheduler for scheduling Term Rewriting System rules including a priority encoder, according to a prior art implementation.
Figure 5:
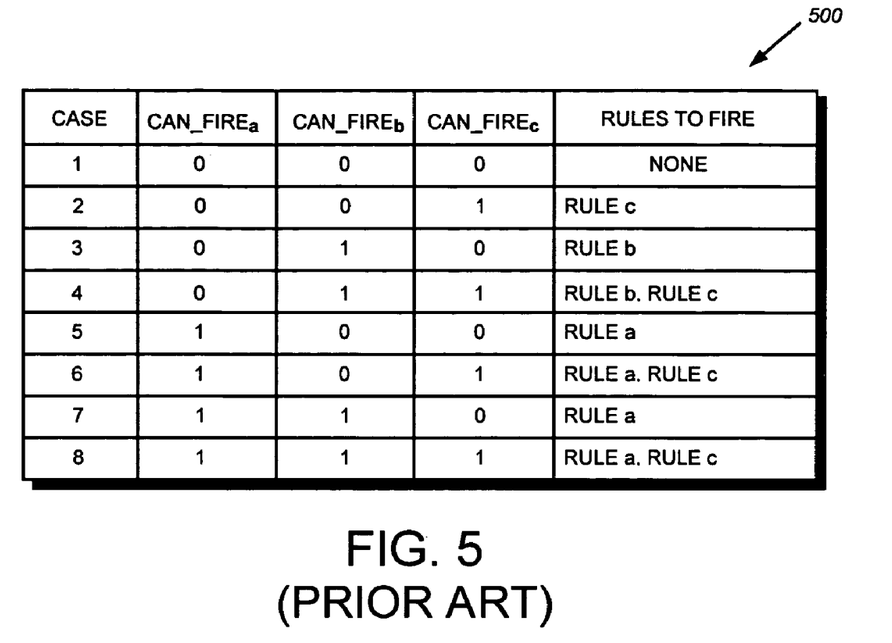
FIG. 5 is an exemplary lookup table that may be constructed by an enumerated scheduler to schedule a hypothetical set of Term Rewriting System rules, according to a prior art implementation.
Figure 6:
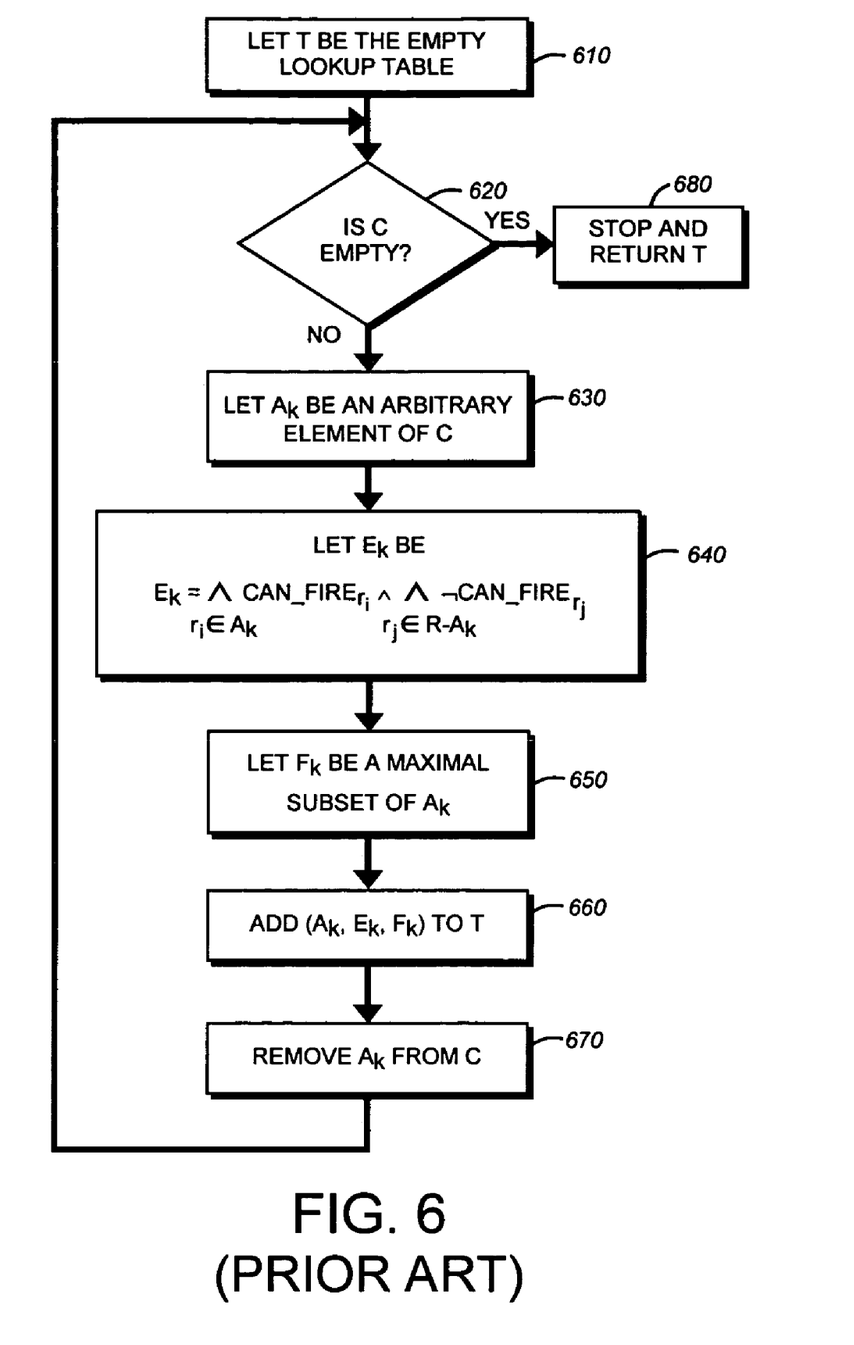
FIG. 6 is a flow diagram showing a series of steps used to compute a lookup table for use with an enumerated scheduler, according to a prior art implementation.

For purposes of comparison to the inventive system and method, FIGS. 4, 5, and 6 show prior art implementations of schedulers that have been previously employed to schedule TRS rules. These prior art schedulers lack the advantages of the new scheduling system and method, and generally have been found unsuitable for scheduling large, highly complex circuits.

FIG. 4 is a more detailed block diagram of a scheduler 310 including a priority encoder 410 according to a prior art implementation. Such a priority encoder addresses conflicts by ensuring only a single rule will execute in each clock cycle. Since only a single rule is triggered, conflicts between rules may be ignored. A priority encoder functions in a manner similar to a series of "if" statements, where statements are evaluated in a preset order and only one statement executes at a time.

A potential issue with priority encoders is the possibility of starvation, a condition where one or more rules is repeatedly not executed in favor of other rules. To partially address this, priority encoder 410 may also implement a round-robin algorithm which ensures fairness among the TRS rules by giving preference to rules which have not executed in some time. Thus priority encoder 410 may be a round-robin priority encoder in one implementation.

While a priority encoder, as shown in FIG. 4, has the advantage of very simply producing a valid schedule, the approach proves otherwise deficient. Since only a single rule executes in a given cycle, the resulting hardware generated is typically quite inefficient and unsuitable for high-speed, complex circuits.

In another prior art implementation, scheduler 310 may be an enumerated scheduler that employs an enumerated encoder table, a lookup table constructed to contain an explicit listing of rules that can execute given a certain combination of applicable rules. The enumerated scheduler seeks to schedule the largest number of non-conflicting rules in a given cycle. Each possible combination of applicable rules is considered. For a system with n rules, $2^n$ possible sets of n rules must be considered, thereby requiring a lookup table of dimension $2^n$ by n in the best known implementation. The lookup table is subsequently subject to logical optimization to derive more concise logic expressions to control the execution of the rules.

The operation of the enumerated scheduler may be understood more fully by reference to a hypothetical example. Consider a hypothetical system with two single-port memories, mem1 and mem2, and the following set of three TRS rules:

rule a( );
    reg1<=mem1.read(1);

```
endrule: a
rule b( );
    reg2<=mem1.read(2);
endrule: b
rule c( );
    reg3<=mem2.read(3);
endrule: c
```

Two rules, a and b, may attempt to access the same read port on the memory mem1, thus only one of them may be executed on any given clock cycle. Rule c, on the other hand, does not conflict with either rule a or rule b and can execute concurrently with either rule.

FIG. 5 shows an exemplary lookup table 500 that may be constructed by the prior art enumerated scheduler to schedule the hypothetical set of rules discussed above. The exemplary lookup table 500 contains cases for all possible combinations of applicable rules and for each case indicates the maximal combination of rules that may execute given the conflicts. Since the table is based upon an example that involves n=3 rules, lookup table 500 include eight possible cases, that is, $2^3$ combinations of the rules. Considering case 1, where CAN_FIRE$_a$ and CAN_FIRE$_b$ and CAN_FIRE$_c$ are all 0, that is, logical false, no rule will assert since no rule is applicable. Considering case 2 in lookup table 500, where CAN_FIRE$_a$ and CAN_FIRE$_b$ are 0, and CAN_FIRE$_c$ is 1, that is, logical true, rule c is asserted since the rule is applicable and does not conflict with any other applicable rule. Cases 3 through 8 operate according to similar principles, each case indicating a set of rules to execute for a particular combination of CAN_FIRE signals.

As discussed above, logical optimizations may be performed on the lookup table to produce more concise logic expressions to control the execution of the rules. Considering the exemplary lookup table 500, the table may be reduced to the following three logic statements:

WILL_FIRE$_a$=CAN_FIRE$_a$
WILL_FIRE$_b$=CAN_FIRE$_b \wedge \neg$CAN_FIRE$_a$
WILL_FIRE$_c$=CAN_FIRE$_c$ Thus, while the computation performed by an enumerated scheduler may involve a table of exponential size, the results are often quite succinct.

The enumerated scheduler may be understood more formally by reference to FIG. 6. FIG. 6 is a flow diagram showing a series of steps used to compute a lookup table in an enumerated scheduler. Let R=$r_1, r_2, \ldots r_n$ be the set of rules in the system, and let C=$A_1, A_2, \ldots A_n$ be the set of all possible combinations of applicable rules, covering all rules in R. The sequence begins at step 610 where T is defined to be an empty lookup table, that is, one containing no cases. Proceeding to step 610, a test is performed to determine if C is empty. Since the set C represents all possible combinations of applicable rules, an empty C implies no rules are applicable. If C is empty, we proceed to step 680, the sequence terminates and lookup table T is returned. Otherwise, step 630 is reached where $A_k$, a possible set of applicable rules, is assigned to be an arbitrary element of set C. Next at step 640, $E_k$, the corresponding logic expression for the combination of asserted CAN_FIRE signals, is defined as shown in FIG. 6. Subsequently at step 650, $F_k$, the corresponding set of executing rules, is defined to be a maximal subset of $A_k$ so that no two rules in $F_k$ conflict. Then at step 660, the set ($A_k, E_k, F_k$) is added to table T. Finally at step 670, $A_k$ is removed from set C and execution subsequently proceeds back to decision step 620. Thereby a computational loop occurs until the condition of step 620 becomes true.

With proper logic optimization, enumerated schedulers have been found to produce efficient hardware. However, since the best known implementation requires a lookup table of exponentially related size, worst-case performance is generally exponentially related to the number of TRS rules. That is, for each rule added, the enumerated scheduler's runtime approximately doubles. In addition, memory usage rapidly expands. Thus, for highly complex circuits, the computing resources necessary to implement an enumerated scheduler prove to be prohibitive.

Further, the enumerated scheduler does not completely resolve nondeterminsim, as the schedule produced is often one of several equally possible schedules. That is, the enumerated scheduler will schedule the largest possible number of TRS rules on a given cycle, but there may be several largest possible combinations, whereby only one is chosen. For example, referring to FIG. 5, in cases 7 and 8 CAN_FIRE$_a$ and CAN_FIRE$_b$ are both true. Yet only one rule, either rule a or rule b, can be executed to avoid a conflict. In the exemplary lookup table 500, rule a is consistently preferred over rule b, as rule a is asserted in both cases. This decision is made arbitrarily, absent a clear heuristic or input by the designer, and thus decreases the predictability of the schedule generated. Therefore, while producing efficient hardware, the enumerated scheduler suffers several shortcomings.

To address the shortcoming of the prior art schedulers, a new system and method of scheduling TRS rules is required.

Accordingly, in an illustrative embodiment, scheduler 310 employs a new scheduling system and method that involves a preference order. The scheduler uses the preference order to schedule conflicting rules, scheduling a more preferred applicable conflicting rule to execute when in conflict with a less preferred applicable conflicting rule. In this way, the most preferred rule of a conflicting set is scheduled to execute on a given state. In summary, where two or more rules conflict, and only one may be chosen to execute, the preference order is used to break the tie. Non-conflicting applicable rules are allowed to execute concurrently with the chosen conflicting rule.

In one embodiment, the preference order may be a user-specified preference order, where the order is enumerated by a designer or other user according to the their preferences. In such an embodiment, the scheduler effectively delegates many scheduling decisions to the designer, allowing the designer greater control over the synchronous circuit specification developed.

It is expressly contemplated, though, that the preference order may be a non-user-specified order created without designer input. For example, in an alternate embodiment, the specified order may be generated by the TRSC according to a heuristic, where certain types of rules are preferred over other types of rules. Such a system may achieve some or all of the advantages of the present invention.

In either the user-specified or the non-user-specified embodiments, preference order may be chosen according to a variety of criteria. In one embodiment, preference order may be chosen according to efficiency criteria where the conflicting rule believed most essential for efficient hardware is selected to execute over less essential rules. Efficiency criteria may depend on the structure of the particular synchronous circuit being developed, and on the design requirements for that particular circuit. While the concept of efficiency may be adventurously employed in rule ordering, it is expressly contemplated that other ordering methods, that do not involve the concept of efficiency, may be used to achieve some or all of the advantages of the present invention. For example, preference order may represent an order beneficial for debugging purposes or an order that has been verified for correctness.

In the user-specified embodiment discussed above, the user-specified preference order may be enumerated in an attribute statement, a form of statement similar to a pragma that has meaning to the scheduler and is commonly used to communicate performance requirements. For example, user-specified preference order may be enumerated by an attribute statement in the exemplary form:

(*descending_urgency="a,b"*)

where a comma-separated list of rule names (in the above example, "a, b") indicates an order preference (in the above example, preference for rule a over rule b). Alternately, the user-specified preference order may be expressed using other well-known structures, or even by the order the rules are listed in the asynchronous circuit specification. In one embodiment the preference order is based upon generalized "urgency." An urgency order, among others, allows for data dependency between rules. In general, the use of the scheduling system and method allows for such data dependency. Notably, unlike an enumerated scheduler in which recursive logic may arise, the scheduler need not be aware of all enabled rules at once, thereby allowing some enabled rules to be decided first and others to be decided later.

Further, the user-specified preference order need not be entered for every rule, only for rules that conflict and therefore may not execute concurrently. Non-conflicting rules will execute whenever their predicates are true. Thus, additional designer input may be quite limited in situations where few rules conflict.

Operation of the above scheduling system and method may be illustrated by referring to the previously discussed hypothetical set of rules. The reader is reminded that these hypothetical rules are merely an illustration of one possible set of rules the scheduler may operate upon, and in no way limit the function, syntax, or other aspects of the rules this invention is applicable to. Stated again, the hypothetical set of rules read:

rule a( );
  reg1<=mem1.read(1);
endrule: a
rule b( );
  reg2<=mem1.read(2);
endrule: b
rule c( );
  reg3<=mem2.read(3);
endrule: c where rules a and b conflict. Applying the preference order of rule a over rule b, the new is scheduler would produce the following three logic statements:

WILL_FIRE$_a$=CAN_FIRE$_a$
WILL_FIRE$_b$=CAN_FIRE$_b$∧¬CAN_FIRE$_a$
WILL_FIRE$_c$=CAN_FIRE$_c$

Note that, these are the very same logical statements produced for the hypothetical rules by the enumerated scheduler discussed previously.

Figure 7:
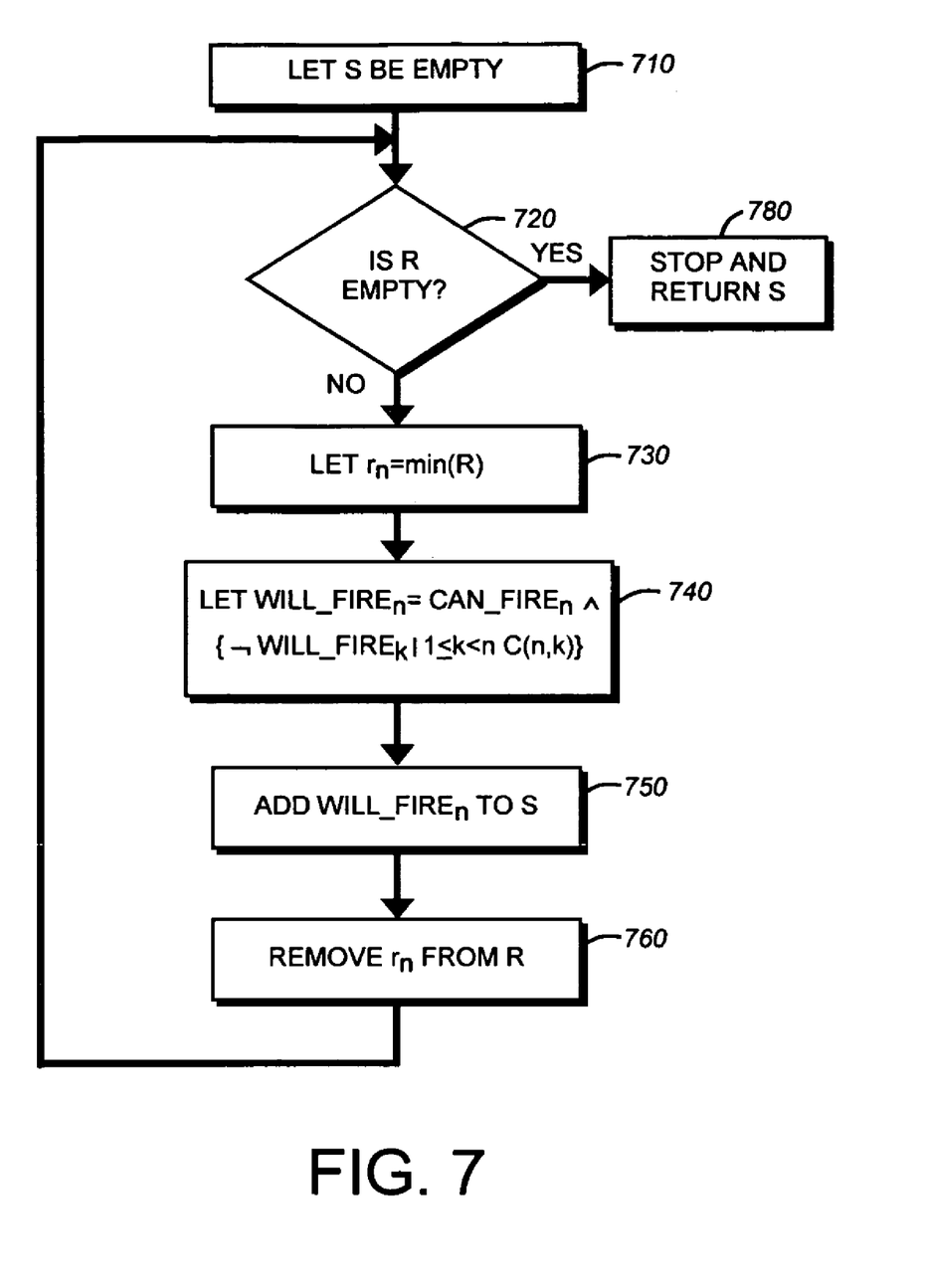
FIG. 7 is a flow diagram showing a series of steps used to implement a scheduler including preference order, according to an illustrative embodiment of this invention.

The new scheduling system and method may be understood more formally by reference to FIG. 7. FIG. 7 is a flow diagram showing a series of steps used to implement a scheduler involving preference order, according to the illustrative embodiment. First let R=$r_1, r_2, \ldots, r_n$ be the set of rules in the system ordered so that $r_i$ is more preferred than $r_j$ if and only if i<j. Further, let S be a set of WILL_FIRE signals for all rules in the system. Also let the function C(i,j) be true if and only if rules $r_i$ and $r_j$ conflict. The process begins at step 710 where schedule S is set to empty, that is, the schedule S indicates no WILL_FIRE signals should be asserted. Next at step 720, a test is performed to determine if set R is empty, that is, if there are any further rules in the set to be considered. If R is empty, execution proceeds to step 780 where the sequence terminates and the set of WILL_FIRE signals S is returned. Otherwise, step 730 is reached where $r_n$ is set to equal min(R), that is, $r_n$ is defined to be the most preferred rule in R. Next at step 740, WILL_FIRE$_n$ is defined to be CAN_FIRE$_n$∧ {¬WILL_FIRE$_k$|1≦k<n, C(n,k)}. Proceeding to step 740, WILL_FIRE$_n$ is added to set S. Finally, at step 750 rule $r_n$ is removed from set of rules R and execution subsequently proceeds back to decision step 720. The sequence of steps continues to loop until decision step 720 becomes true. In this way, the scheduler schedules conflicting rules in decreasing preference until no further rules are applicable.

The scheduler described above has several advantages over other scheduling methods. First, the new scheduler has been found to generate a high quality synchronous circuit specification, often equivalent to hand-coded RTL code, and generally superior to those produced by priority schedulers.

Second, the scheduler demonstrates improved performance as it generates a schedule in time polynomially related to the number or rules to be scheduled. Mathematically it can be seen that for a system with n rules, the schedule must comprise n WILL_FIRE equations. Any given equation k for rule $r_k$ will contain a CAN_FIRE$_k$ term conjoined with at most k−1 negated WILL_FIRE terms from previously scheduled rules, yielding a total of k terms. It may be calculated that for a system of n rules that $(n^2+n)/2$ terms will be considered to produce the schedule. Given the number of terms considered is a polynomial function of the number of rules, the processing time required is likewise polynomially related to the number of rules. This relation has clear advantage over the exponential relationship of the enumerated scheduler, allowing the new scheduler to be practically employed with large, highly complex systems. Further, the expressions produced by the new scheduler are simpler and generally do not require extensive logic optimization as required by the enumerated scheduler.

Further, the scheduler simplifies debugging by allowing a designer to readily understand why a particular applicable rule is not executing. If applicable rule $r_n$ is not executing, it is because it is being blocked by a preferred conflicting rule $r_k$. If this particular ordering is not desired, the preference order may be modified.

Referring again to the user-specified embodiment, while a designer may include user-specified preference order initially in the asynchronous circuit specification, conflicts between rules are often not apparent, or apparent only after significant analysis, at this point in the design process. Therefore, according to another aspect of the scheduler, rule order warning messages may be employed to aid the design process.

Figure 8:
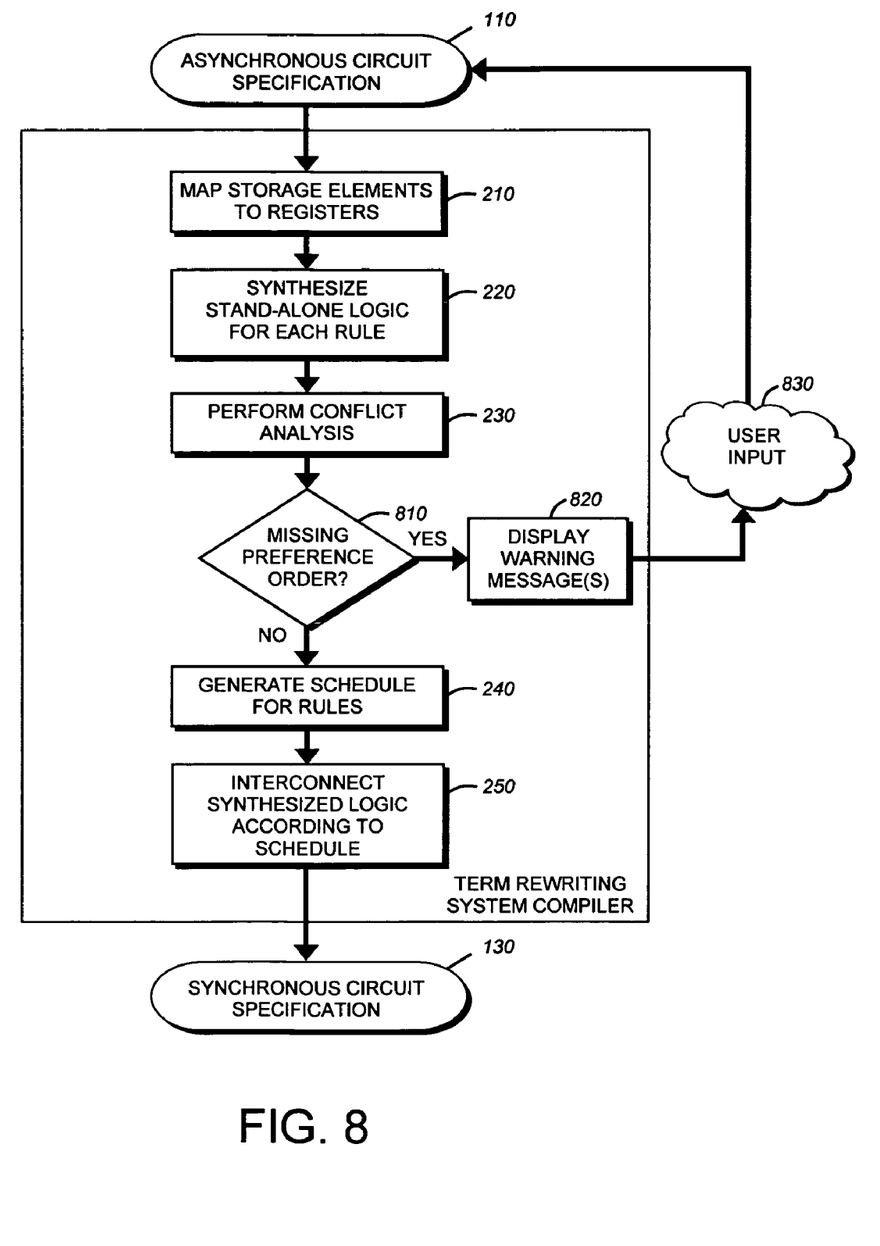
FIG. 8 is a flow diagram that integrates input of user-specified preference order into the generation of a synchronous circuit specification from an asynchronous circuit specification.

FIG. 8 is a flow diagram that integrates input of user-specified preference order into the generation of a synchronous circuit specification from an asynchronous circuit specification. As can be seen, FIG. 8 builds upon FIG. 2, and thus reference to previous descriptions may be helpful. As described above, at step 210, the TRSC 120 maps any storage elements specified in asynchronous circuit specification 110 into registers or other predefined circuit elements. Next, in step 220, the TRSC 120 synthesizes enabling logic from the predicate, and updating logic from the action body of each rule. At step 230 conflict analyses is performed on the TRS rules Subsequently at decision step 810, the TRSC determines whether user-specified preference order has been enumerated for all conflicting rules. If user-specified preference order is missing for one or more conflicting rules, the system may assume an order enabling compilation to proceed. This assumed order may be an order generated by the TRSC according to a defined heuristic. Execution may proceed to step 820 where one or more warning messages describing a conflict are displayed to the user. Such messages include conflict information enabling the user to locate the conflict and may be displayed to the user on a screen, written to a log file, or presented in another appropriate manner. Subsequently, at cloud 830, the user may edit the asynchronous specification to include additional user-specified information. Thereafter, the user may attempt to re-compile the asynchronous specification and again proceed through the sequence of steps represented in FIG. 8. If all required user-specified preference order is present (or the system assumes an order), a schedule is generated at step 240. Thereafter, at step 250, the synthesized logic is interconnected according to the schedule and synchronous circuit specification 130 is produced.

In an alternate embodiment, the warning messages displayed in step 820 may be interactive dialog messages where the user is questioned on preferred rule order. Such an interactive dialog may automatically modify the underlying asynchronous specification to include the user's choices.

In another alternate embodiment, if a user-specified preference order is absent, the scheduler may default to another scheduling method to schedule the particular conflict. In this way, the new scheduler may be advantageously employed in conjunction with other scheduling methods.

Also, while this description focuses upon application of rules, it is expressly contemplated that the term "rules" as used herein may be taken broadly in alternate embodiments to include separately compiled modules with methods. In such a case preference order (urgency, for example) is specified by the user and by the module's interface—wherein this interface was either derived from user-specified annotations on the source of that module or specified along with the module provided as a circuit primitive (and/or gates, logic blocks, etc.). In this regard, methods may be scheduled like rules in which a predicate is supplied from outside of the module. As such this description should be taken broadly to define method scheduling under the definition of rules scheduling.

The foregoing has been a detailed description of a several embodiments of the present invention. Further modifications and additions can be made without departing from the invention's intended spirit and scope. It is expressly contemplated that any or all of the processes and data structures described above can be implemented in hardware, software or a combination thereof. A software implementation may comprise a computer-readable medium containing executable program instructions for execution on a computer. It should be remembered that the above descriptions are meant to be taken only by way of example, and not to otherwise limit the scope of this invention.

What is claimed is:

1. A method for scheduling a plurality of Term Rewriting System (TRS) rules in a hardware design system, comprising:
   providing a preference order for a set of three or more conflicting TRS rules of the plurality of TRS rules, wherein the preference order indicates an order for the scheduling of each rule in the set of three or more conflicting TRS rules such that a preferred rule in the set of three or more conflicting TRS rules is scheduled to execute when in conflict with a less-preferred rule in the set of three or more conflicting TRS rules
   scheduling for execution on a state of the hardware design system, multiple TRS rules from the set of three or more conflicting TRS rules, such that a most preferred rule in the preference order is scheduled to execute before other less-preferred TRS rules in the set of three or more conflicting TRS rules; and
   wherein each of the less-preferred TRS rules in the set are scheduled to execute in decreasing preference until each conflicting rule has been scheduled.

2. The method of claim 1 further comprising the step of:
   scheduling for execution on the state, one or more non-conflicting TRS rules of the plurality of TRS rules.

3. The method of claim 1 wherein the step of providing further comprises the step of:
   enumerating, by a user, the preference order for the set of three or more conflicting TRS rules, and
   wherein the preference order is a user-specified preference order.

4. The method of claim 3 wherein the step of enumerating further comprises the step of:
   listing, by a user, the user-specified preference order for the set of three or more conflicting TRS rules in an attribute statement.

5. The method of claim 3 further comprising the step of:
   displaying one or more messages to the user, the one or more messages including conflict information concerning one or more rules from the set of three or more conflicting TRS rules.

6. The method of claim 1 wherein the step of providing further comprises the step of:
   generating according to a heuristic, by the hardware design system, the preference order for the set of three or more conflicting TRS rules.

7. The method of claim 1 wherein the step of scheduling further comprises the step of:
   computing, in a time frame polynomially related to the number of TRS rules in the plurality of TRS rules, a schedule for the execution of the plurality of TRS rules.

8. The method of claim 1 wherein the preference order is chosen according to efficiency criteria and being preferred in the preference order represents being more essential for efficient hardware.

9. A hardware design system having a plurality of Term Rewriting System (TRS) rules, comprising:
   a preference order for a set of three or more conflicting TRS rules of the plurality of TRS rules, wherein the preference order indicates an order for the scheduling of each rule in the set of three or more conflicting TRS rules such that a preferred rule in the set of three or more conflicting TRS rules is scheduled to execute when in conflict with a less-preferred rule in the set of three or more conflicting TRS rules; and
   a Term Rewriting System Compiler (TRSC) adapted to schedule for execution on a state of the hardware design system multiple TRS rules from the set of three or more conflicting TRS rules, such that a most preferred rule in the preference order is scheduled to execute before other less-preferred TRS rules in the set of three or more conflicting TRS rules.

10. The hardware design system of claim 9 wherein the TRSC is further adapted to schedule for execution on the state one or more non-conflicting TRS rules of the plurality of TRS rules.

11. The hardware design system of claim 9 wherein the preference order is a user-specified preference order.

12. The hardware design system of claim 11 further comprising:

an attribute statement for specifying the user-specified preference order for the set of three or more conflicting TRS rules.

13. The hardware design system of claim 11 further comprising:
one or more warning messages adapted for display to a user, the one or more warning messages including conflict information concerning one or more rules from the set of three or more conflicting TRS rules.

14. The hardware design system of claim 9 further comprising:
a heuristic for generating the preference order for the set of three or more conflicting TRS rules.

15. The hardware design system of claim 11 wherein the preference order is according to efficiency criteria and being preferred in the preference order represents being more essential for efficient hardware.

16. A computer readable medium containing executable program instructions which, when executed by the computer, perform the scheduling of a plurality of Term Rewriting System (TRS) rules in a hardware design system, the executable program instruction comprising program instruction for:
providing a preference order for a set of We three or more conflicting TRS rules of the plurality of TRS rules, wherein the preference order indicates an order for the scheduling of each rule in the set of three or more conflicting TRS rules such that a preferred rules in the set of three or more conflicting TRS rules is scheduled to execute when in conflict with a less-preferred rule in the set of three or more conflicting TRS rules; and
scheduling for execution on a state of the hardware system, multiple TRS rules from the set of three or more conflicting TRS rules, such that a most preferred rule in the preference order is scheduled to execute before other less-preferred TRS rules in the set of three or more conflicting TRS rules.

17. The computer readable medium of claim 16 further comprising program instructions for:
scheduling for execution on the state, one or more non-conflicting TRS rules of the plurality of TRS rules.

18. The computer readable medium of claim 16 further comprising program instructions for:
receiving the preference order for the set of we three or more conflicting TRS rules from a user, and
wherein the preference order is a user-specified preference order.

19. A hardware circuit produced according to a process that comprises the steps of:
providing a preference order for a set of three or more conflicting TRS rules of a plurality of TRS rules, wherein the preference order indicates an order for the scheduling of each rule in the set of three or more conflicting TRS rules such that a preferred rule in the set of three or more conflicting TRS rules is scheduled to execute when in conflict with a less-preferred rule in the set of three or more conflicting TRS rules; and
scheduling for execution on a state of the hardware circuit, multiple TRS rules from the set of three or more conflicting TRS rules, such that a most preferred rule in the preference order is scheduled to execute before other less-preferred TRS rules in the set of three or more conflicting TRS rules.

20. The hardware circuit of claim 19 produced according to a process that further comprises the steps of:
scheduling for execution on the state, one or more non-conflicting TRS rules of the plurality of TRS rules.

21. The hardware circuit of claim 19 produced according to a process that further comprises the steps of:
enumerating, by a user, the preference order for the set of three or more conflicting TRS rules, and
wherein the preference order is a user-specified preference order.

* * * * *